US010958263B2

(12) United States Patent
Yamada et al.

(10) Patent No.: US 10,958,263 B2
(45) Date of Patent: Mar. 23, 2021

(54) DRIVE CONTROL DEVICE, DRIVE CIRCUIT, AND VEHICLE

(71) Applicant: SEIKO EPSON CORPORATION, Tokyo (JP)

(72) Inventors: Toshimichi Yamada, Chino (JP); Tatsuro Shinmitsu, Fujimi-machi (JP); Kazuhiko Okawa, Chino (JP); Hiroaki Nitta, Sakata (JP); Masahiro Hayashi, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/813,839

(22) Filed: Mar. 10, 2020

(65) Prior Publication Data

US 2020/0295746 A1 Sep. 17, 2020

(30) Foreign Application Priority Data

Mar. 11, 2019 (JP) .............................. JP2019-043347

(51) Int. Cl.
| H03K 17/0812 | (2006.01) |
| H03K 17/00 | (2006.01) |
| G05F 1/56 | (2006.01) |
| H03K 17/0814 | (2006.01) |

(52) U.S. Cl.
CPC ......... *H03K 17/08122* (2013.01); *G05F 1/56* (2013.01); *H03K 17/007* (2013.01); *H03K 17/08142* (2013.01)

(58) Field of Classification Search
CPC ........... H03K 17/08122; H03K 17/007; H03K 17/08142; H03K 17/0814; H03K 17/04106; H03K 17/041; H03K 17/0412; H03K 17/04123; H03K 17/04163; H03K 17/0416; G05F 1/56; H02P 21/00
See application file for complete search history.

(56) References Cited

U.S. PATENT DOCUMENTS

| 4,858,055 A * | 8/1989 | Okitaka | .............. H01L 27/0251 |
| | | | 361/56 |
| 8,487,664 B2 * | 7/2013 | Draxelmayr | ...... H02M 3/33553 |
| | | | 327/108 |
| 2004/0263132 A1 | 12/2004 | Fukami | |
| 2013/0265028 A1 | 10/2013 | Choi et al. | |

FOREIGN PATENT DOCUMENTS

| JP | 2005-019532 A | 1/2005 |
| JP | 2013-102658 A | 5/2013 |
| JP | 2013-220016 A | 10/2013 |

* cited by examiner

*Primary Examiner* — Jung Kim
(74) *Attorney, Agent, or Firm* — Oliff PLC

(57) ABSTRACT

Provided is a drive control device including: a first output node coupled to a gate node of a high-side transistor; a second output node coupled to a drive node; a first transistor provided between a first power supply node and the first output node; and a current limiting circuit and a second transistor provided in series between the first output node and the second output node, in which the current limiting circuit limits a current from the drive node toward the first output node to a predetermined value. The current limiting circuit is, for example, a transistor having a direction opposite to that of the second transistor.

6 Claims, 12 Drawing Sheets

DRIVE CONTROL DEVICE, DRIVE
CIRCUIT, AND VEHICLE

The present application is based on, and claims priority from JP Application Serial Number 2019-043347, filed Mar. 11, 2019, the disclosure of which is hereby incorporated by reference herein in its entirety.

BACKGROUND

1. Technical Field

The present disclosure relates to a drive control device, a drive circuit, and a vehicle, for example.

2. Related Art

For example, as a technique for driving a three-phase motor, a technique is known in which a high-side transistor and a low-side transistor provided for each phase are controlled by a drive control device integrated into a semiconductor (for example, refer to JP-A-2013-102658).

Since a motor is equivalent to an inductor from an electrical perspective, a surge voltage is generated by switching the rotation direction of the motor. Further, in the above-described high-side transistor and low-side transistor, since the transistor size is increased in order to reduce the resistance, a surge voltage is generated by switching.

When such a surge voltage is input through a node of a drive control device integrated into a semiconductor, an internal element of the drive control device may be destroyed.

SUMMARY

A drive control device according to an aspect of the present disclosure is a drive control device for controlling a motor coupled to a first drive node and a second drive node by driving a first high-side transistor provided between a first power supply node having a first power supply potential and the first drive node, a first low-side transistor provided between the first drive node and a second power supply node having a second power supply potential lower than the first power supply potential, a second high-side transistor provided between the first power supply node and the second drive node, and a second low-side transistor provided between the second drive node and the second power supply node, the device including: a first output node coupled to a gate node of the first high-side transistor; a second output node coupled to the first drive node; a third output node coupled to a gate node of the first low-side transistor; a fourth output node coupled to a gate node of the second high-side transistor; a fifth output node coupled to the second drive node; a sixth output node coupled to a gate node of the second low-side transistor; a first transistor provided between the first power supply node and the first output node; a first diode and a second transistor provided in series between the first output node and the second output node; a third transistor provided between the first power supply node and the fourth output node; and a second diode and a fourth transistor provided in series between the fourth output node and the fifth output node, in which the first to fourth transistors are enhancement types, a forward direction of the first diode is a direction from the first output node toward the second output node, and a forward direction of the second diode is a direction from the fourth output node toward the sixth output node.

DESCRIPTION OF EXEMPLARY EMBODIMENTS

Hereinafter, a drive control device according to an embodiment will be described with reference to the drawings.

In each figure, the size and scale of each part are appropriately changed from the actual ones. Further, since the embodiments described below are desirable specific examples of the present disclosure, various technically desirable limitations are given. However, the scope of the present disclosure is not limited to these forms unless otherwise specified in the following description.

Figure 1:
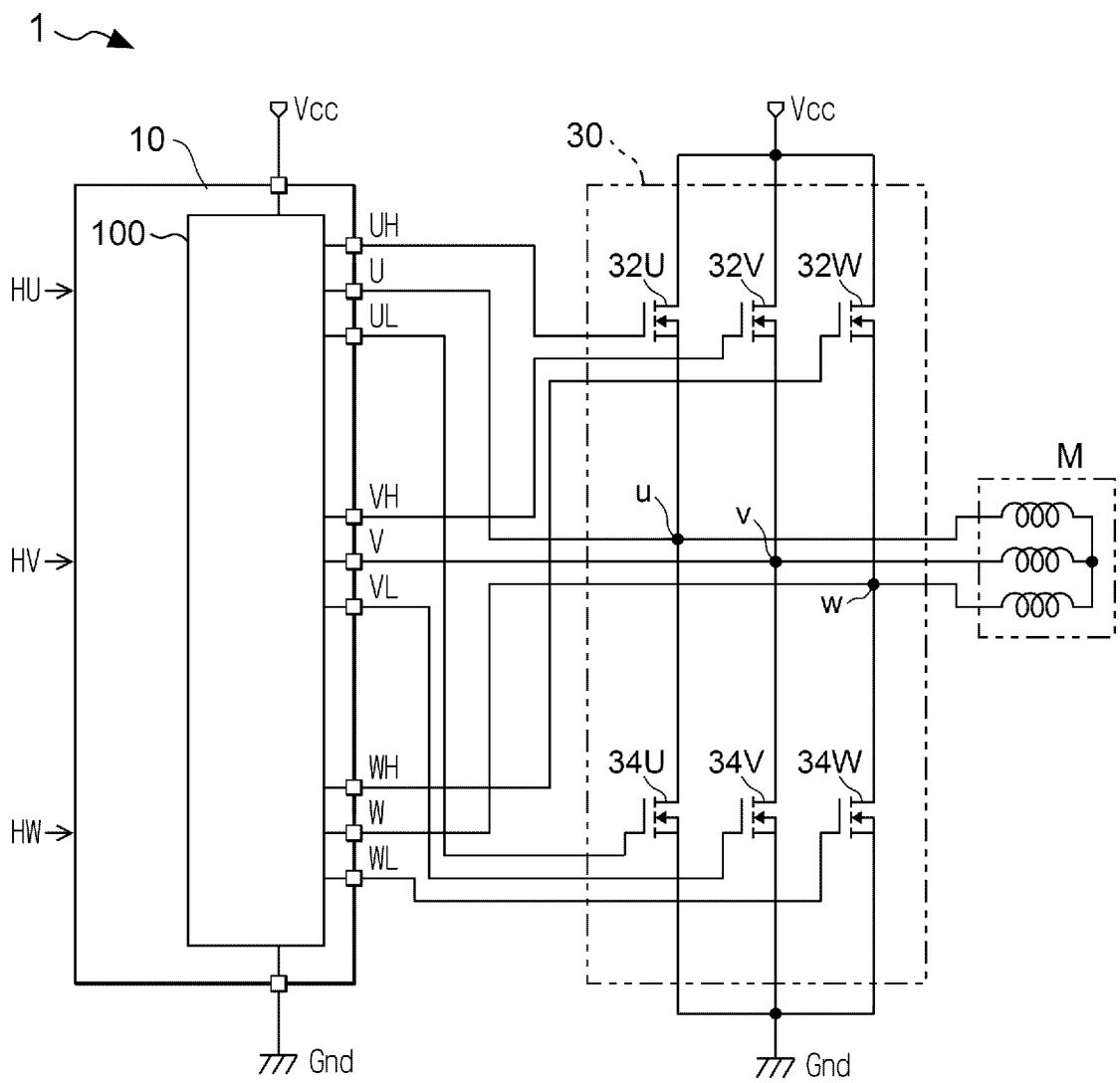
FIG. 1 is a diagram showing a configuration of an electric apparatus including a drive control device according to a first embodiment.

FIG. 1 is a diagram showing an example of an electric apparatus 1 including a drive control device 10 according to a first embodiment. As shown in FIG. 1, the electric apparatus 1 includes the drive control device 10, a drive circuit 30, and a motor M. Examples of the electric apparatus 1 include an apparatus for increasing/decelerating the rotation of the motor M and switching between normal/reverse rotations, particularly a vehicle that moves using the motor M as power.

The motor M is a three-phase brushless motor driven by signals output from nodes u, v, and w. For the convenience of explanation, in the present embodiment, the motor M is a three-phase motor, but it may be a two-phase motor that omits the W-phase or may be a motor that is four-phase or more.

A rotor rotational position of the motor M is detected by a sensor (not shown), and sensor signals HU, HV, and HW indicating the rotational position are input to the drive control device 10. The drive control device 10 is a semiconductor integrated circuit having nodes UH, U, UL, VH, V, VL, WH, W, and WL, and includes a pre-driver 100.

The pre-driver 100 generates high-side and low-side control signals for each phase according to the sensor signals HU, HV, and HW. Specifically, the pre-driver 100 generates high-side and low-side control signals of a U-phase and outputs the signals via nodes UH and UL. Further, the pre-driver 100 generates high-side and low-side control signals of a V-phase, outputs the generated signals via nodes VH and VL, generates high-side and low-side control signals of a W-phase, and outputs the generated signals via nodes WH and WL.

A node U in the pre-driver 100 is coupled to a node u in the drive circuit 30. Similarly, a node V is coupled to a node v and a node W is coupled to a node w.

In addition to the pre-driver 100, the drive control device 10 includes a protection circuit, a logic circuit, a clock signal generation unit, and the like, which are omitted because these are not directly related to the present case.

In the pre-driver 100, the node UH is an example of a first output node, the node U is an example of a second output node, and the node UL is an example of a third output node. Similarly, the node VH is an example of a fourth output node, the node V is an example of a fifth output node, and the node VL is an example of a sixth output node.

The drive circuit 30 includes high-side transistors 32U, 32V, and 32W coupled between a power supply node, to which a higher power supply voltage Vcc is applied, and the nodes u, v, and w, and low-side transistors 34U, 34V, and 34W coupled between the nodes u, v, and w and a ground node of a ground potential Gnd that is a lower power supply voltage.

Specifically, in terms of the U-phase, for the high-side transistor 32U, a drain node is coupled to the power supply node, a gate node is coupled to the node UH, and a source node is coupled to the node u. Further, for the low-side transistor 34U, the drain node is coupled to the node u, the gate node is coupled to the node UL, and the source node is coupled to the ground node. The high-side transistor 32V and the low-side transistor 34V of the V-phase, and the high-side transistor 32W and the low-side transistor 34W of the W-phase are coupled in the same manner as the high-side transistor 32U and the low-side transistor 34U of the U-phase.

Note that since the high-side transistors 32U, 32V, and 32W and the low-side transistors 34U, 34V, and 34W perform a switching operation, and therefore, for example, an enhancement type is desirable.

The power supply node to which the voltage Vcc is applied is an example of a first power supply node, and the ground node of the ground potential Gnd is an example of a second power supply node. The node u is an example of a first drive node, and the node v is an example of a second drive node.

The high-side transistor 32U is an example of a first high-side transistor, and the high-side transistor 32V is an example of a second high-side transistor. The low-side transistor 34U is an example of a first low-side transistor, and the low-side transistor 34V is an example of a second low-side transistor.

Figure 2:
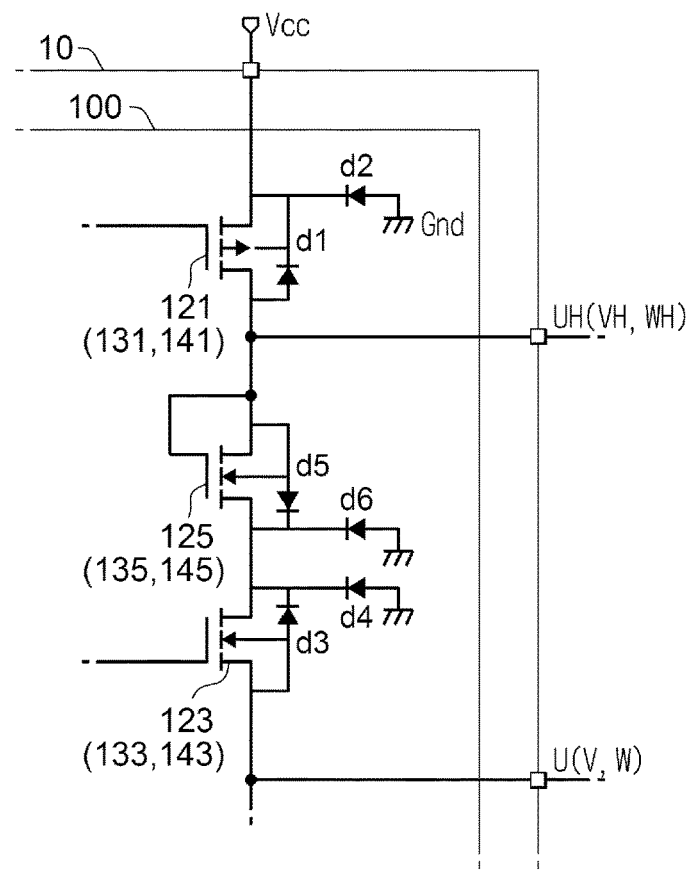
FIG. 2 is a diagram showing a main portion of the drive control device.

FIG. 2 is a diagram showing a main portion configuration of the pre-driver 100. The configuration of an output stage coupled to the nodes UH and U is shown as the main portion.

In FIG. 2, a transistor 121 is an enhancement type P-channel MOS. For the transistor 121, a source node is coupled to the power supply node of voltage Vcc, and a drain node is coupled to the node UH. Note that diodes d1 and d2 are diodes which are parasitic on the transistor 121. Among these, a forward direction of the diode d1 is a direction from the drain node toward the source node, and a forward direction of the diode d2 is a direction from a substrate of a semiconductor integrated circuit (Gnd), that is, the ground node toward the source node.

Transistors 125 and 123 are coupled in series between the node UH and the node U.

Among these, the transistor 123 is an enhancement type N-channel MOS. For the transistor 123, a source node is coupled to the node U, and a drain node is coupled to a drain node of the transistor 125.

Note that diodes d3 and d4 are diodes which are parasitic on the transistor 123. Among these, a forward direction of the diode d3 is a direction from the source node toward the drain node, and a forward direction of the diode d4 is a direction from the ground node toward the drain node.

The transistor 125 is a depletion type N-channel MOS. Note that a depletion type NDMOS is desirable for the transistor 125. The NDMOS is an abbreviation for N-channel type double-diffused metal oxide semiconductor.

For the transistor 125, a source node and a gate node are coupled to the node UH, and the drain node is coupled to the drain node of the transistor 123.

Note that diodes d5 and d6 are diodes which are parasitic on the transistor 125. Among these, a forward direction of the diode d5 is a direction from the source node toward the drain node, and a forward direction of the diode d6 is a direction from the ground node toward the drain node.

Note that a control signal is supplied to the gate node of the transistor 121 from an upper circuit (not shown). Similarly, the control signal is also supplied to the gate node of the transistor 125 from the upper circuit (not shown).

Although the node UH and the node U in the U-phase have been described here, the node VH and the node V in the V-phase, and the node WH and the node W in the W-phase have the same configurations.

Specifically, in the node VH and the node V in the V-phase, as shown in parentheses in FIG. 2, it is configured that the transistor 121 is replaced with a transistor 131, the transistor 123 is replaced with a transistor 133, and the transistor 125 is replaced with a transistor 135, respectively.

The transistor 121 is an example of a first transistor, and the transistor 123 is an example of a second transistor. Further, the transistor 131 is an example of a third transistor, and the transistor 133 is an example of a fourth transistor.

The transistor 125 is an example of a fifth transistor, and the transistor 135 is an example of a sixth transistor. The diode d5 parasitic on the transistor 125 is an example of a first diode, and the diode d5 parasitic on the transistor 135 is an example of a second diode.

Note that in the node WH and the node W in the W-phase, as shown in parentheses in FIG. 2, it is configured that the transistor 121 is replaced with a transistor 141, the transistor 123 is replaced with a transistor 143, and the transistor 125 is replaced with a transistor 145, respectively.

The output stage of the node UL in the U-phase will be described later. The output stage of the node VL in the V-phase and the output stage of node WL in the W-phase will also be described later.

Figure 3:
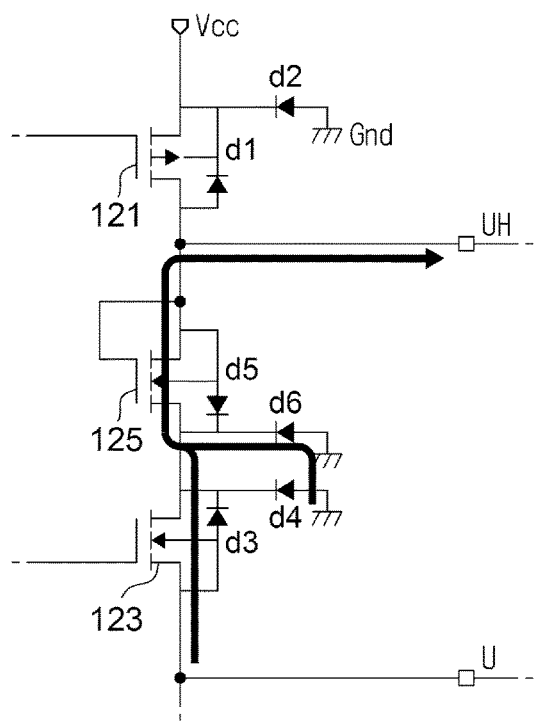
FIG. 3 is a diagram showing a negative surge path in the drive control device.

FIG. 3 shows an example when a negative surge voltage is generated at the node UH due to switching of the rotation direction of the motor M or the like in the configuration of the main portion.

In the depletion type transistor 125, current flows from the drain node toward the source node even when the voltage between the gate node and the source node is zero. When this current becomes large, the voltage between the source node and the drain node increases. However, as the voltage increases, the current flowing from the drain node to the source node is saturated at a certain current value. Therefore, the transistor 125 functions as a current limiting circuit that limits a current passing through a channel area to the current value.

Figure 4:
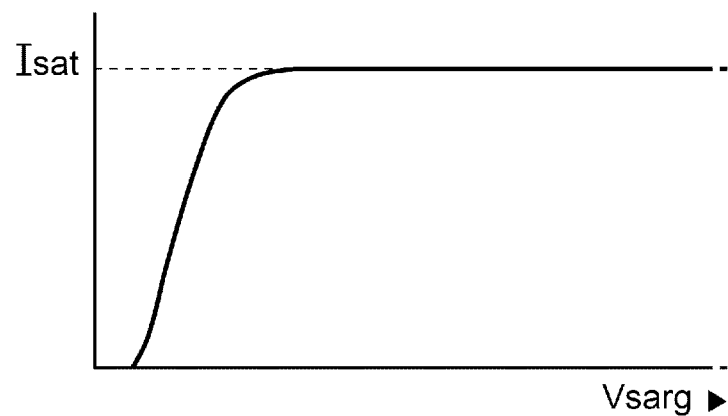
FIG. 4 is a diagram showing a current limitation of a negative surge path by the drive control device.

FIG. 4 shows the characteristics of the current flowing in the channel area of the transistor 125 with respect to the negative surge voltage Vsag at the node UH. Specifically, FIG. 4 shows that the current flowing in the channel area of the transistor 125 is limited to a current value Isat even when the voltage Vsag increases.

The horizontal axis in FIG. 4 indicates the negative surge voltage Vsag, and thus indicates that the negative voltage increases in the absolute value as it goes in the right direction.

The direction in which the negative surge current flows is opposite to the diode d5 that is parasitic on the transistor 125. Therefore, the negative surge current does not flow to the diode d5 but flows to the channel area in the transistor 125. In the channel area of the transistor 125, since the current flowing in the direction from the drain node to the source node is limited to the current value Isat, even when a negative surge voltage is generated, the flowing current does not continue to increase, thereby the destruction of an internal element is prevented.

Figure 5:
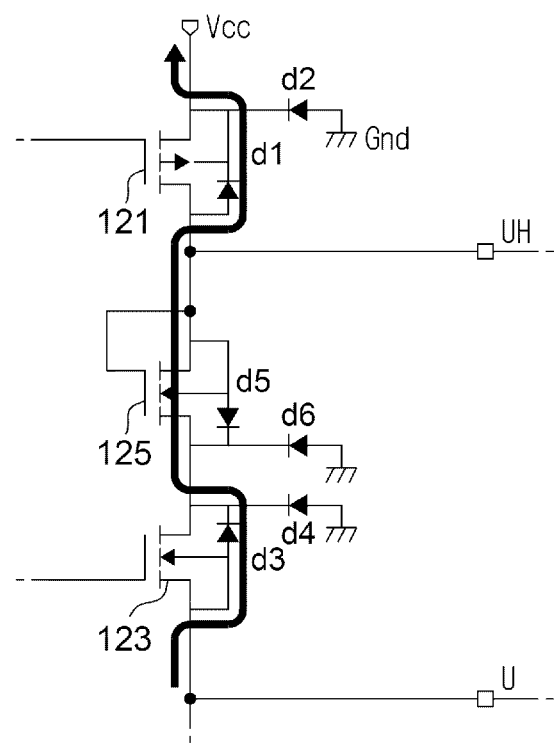
FIG. 5 is a diagram showing a negative surge path in the drive control device.

It is assumed that the negative surge current flows through the current path shown in FIG. 5. Also in this case, since the transistor 125 limits the current, the destruction due to the negative surge is prevented.

In general, the resistance of a channel area in a transistor has a negative temperature coefficient with respect to the temperature. Therefore, even when a negative surge flows into the channel area of the transistor 125 and self-heating occurs since the present embodiment is configured to act in a direction in which the destruction is suppressed, the destruction due to the negative surge can be reliably prevented.

Next, an operation when the voltage of the node UH is rapidly lowered in the control of the motor M, that is, an operation of absorbing a sink current via the node UH (sink operation) will be described.

Figure 6:
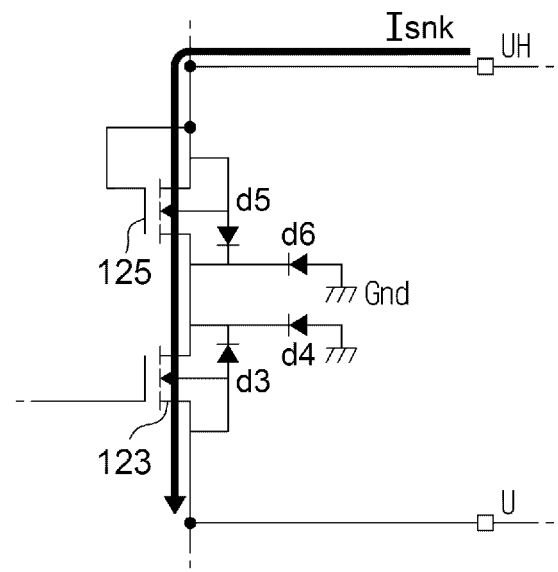
FIG. 6 is a diagram showing a sink current path in the drive control device.
Figure 7:
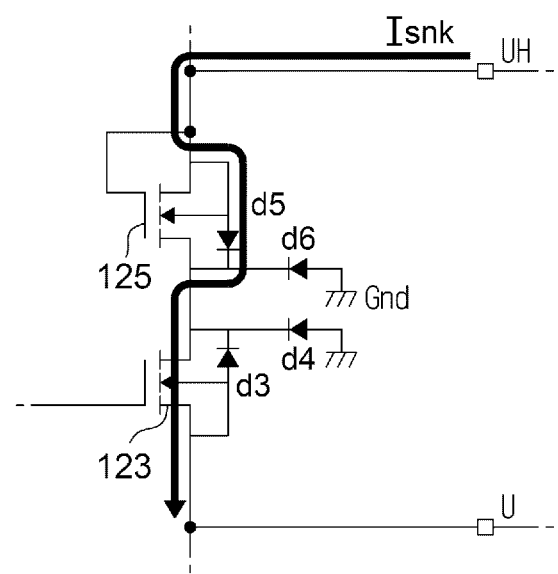
FIG. 7 is a diagram showing a sink current path in the drive control device.

FIGS. 6 and 7 are diagrams showing paths through which the sink current flows.

In the sink operation, the transistor 123 is turned on, and the transistor 121 omitted in FIG. 6 and the like is turned off. When the voltage between the source node and the drain node in the transistor 125 is lower than the voltage at which the diode d5 is turned on, the current flows only in the channel area in the transistor 125. Note that the voltage at which the diode is turned on refers to a voltage at which the current starts to flow in the forward direction.

In this case, a sink current Isnk flows through the path of the channel area of the transistor 125 and the transistor 123 in an ON state, as shown in FIG. 6. When an ON resistance of the transistor 123 is represented as R1 and a resistance in the channel area of the transistor 125 is represented as R2, a resistance R between the node UH and the node U is represented by the following equation (1).

$$R = R1 + R2 \quad (1)$$

When the voltage between the source node and the drain node in the transistor 125 is equal to or higher than the voltage at which the diode d5 is turned on, the current flows in the forward direction of the diode d5 in the transistor 125. Note that the current also flows through the channel area of the transistor 125, but this current is negligibly small compared to the current flowing through the diode d5.

Therefore, the sink current Isnk can be said to flow through the path of the diode d5 of the transistor 125 and the transistor 123 in the ON state, as shown in FIG. 7. When the ON resistance in the forward direction in the diode d5 is ignored, the resistance R becomes only the ON resistance R1 of the transistor 123 as represented by the following equation (2).

$$R = R1 \quad (2)$$

In this manner, the path of the current flowing through the transistor 125 is switched between the case where the voltage between the source node and the drain node in the transistor 125 is lower than the voltage at which the diode d5 is turned on and the case where the voltage between the source node and the drain node in the transistor 125 is equal to or higher than the voltage at which the diode d5 is turned on. This switching will be described in consideration of the actual sink operation at the node UH.

Figure 8:
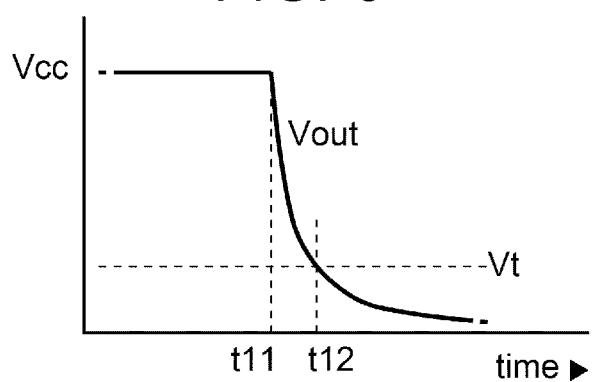
FIG. 8 is a diagram showing a voltage waveform at the time of a sink in the drive control device.

FIG. 8 is a diagram showing a waveform of a voltage Vout of the node UH. Specifically, FIG. 8 is a diagram showing an example of a waveform when the transistor 121 is turned off and the transistor 123 is turned on at time t11 in a state where the voltage Vout of the node UH is maintained at a voltage Vcc by turning on the transistor 121. The voltage Vout when the diode d5 is turned on is represented as Vt.

Immediately after the time t11, since the voltage Vout is equal to or higher than the voltage Vt, the sink current Isnk flows through a low resistance path via the diode d5 and the ON state transistor 123, as shown in FIG. 7. Therefore, the voltage Vout of the node UH attenuates steeply.

Since the current does not flow through the diode d5 after a time t12 in which the voltage Vout becomes lower than the voltage Vt, the sink current Isnk flows through the path via the channel area of the transistor 125 and the ON state transistor 123 as shown in FIG. 6. Therefore, the voltage of the node UH is gradually attenuated.

In this way, when the voltage Vout becomes lower than the voltage Vt, it is difficult to attenuate.

When the forward drop voltage of the diode d5 is represented as Vf, the voltage Vf can be represented by the following equation (3).

$$Vf = R2 \times Isnk \quad (3)$$

When the equation (3) is modified, the sink current Isnk can be represented by the following equation (4).

$$Isnk = Vf / R2 \quad (4)$$

When the voltage Vout of the node UH is the voltage Vt, the following equation (5) is established.

$$(Vout=) Vt = (R1 + R2) \times Isnk \quad (5)$$

By substituting Isnk in the equation (4) into the equation (5), it can be represented as the following equation (6).

$$Vt = \{(R1 + R2)/R2\} \times Vf \quad (6)$$

As can be seen from the equation (6), the voltage Vt at which the sink current Isnk flowing through the transistor 125 switches from one of the diode d5 or the channel area to the other can be designed by the ratio of the resistors R1 and R2. Specifically, the voltage Vt can be designed using the ratio between the size of the transistor 123 and the size of the transistor 125.

As described above, when the voltage Vout becomes lower than the voltage Vt, it is difficult to attenuate. However, by making a threshold value voltage Vth of the transistor 125 lower than the voltage Vt, it is possible to improve the efficiency of the sink operation by improving the point that it is difficult to attenuate.

Specifically, by designing the size of the transistor 125 to be smaller than the size of the transistor 123, R1<R2 is established in the equation (6). Thereby, the voltage Vt can be lowered and the efficiency of the sink operation can be improved.

Figure 9:
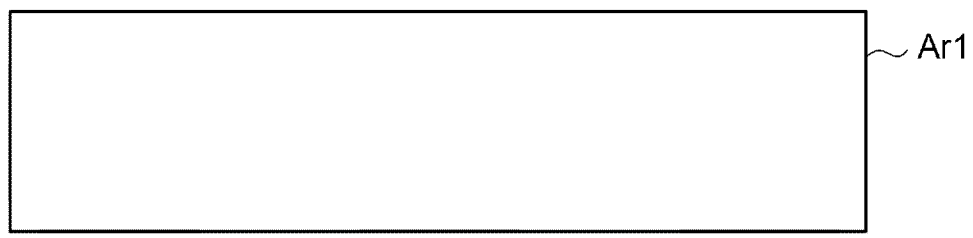
FIG. 9 is a diagram showing an example of a transistor layout in the drive control device.
Figure 9:
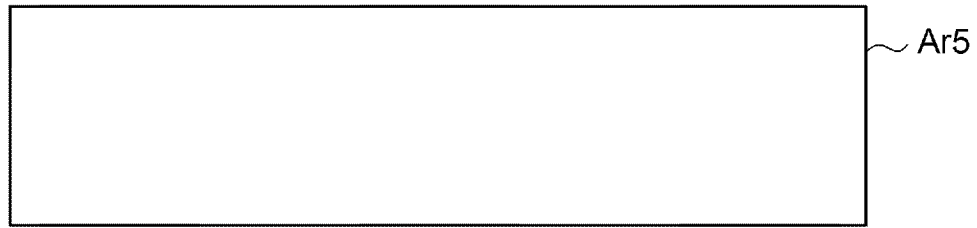
Figure 9:
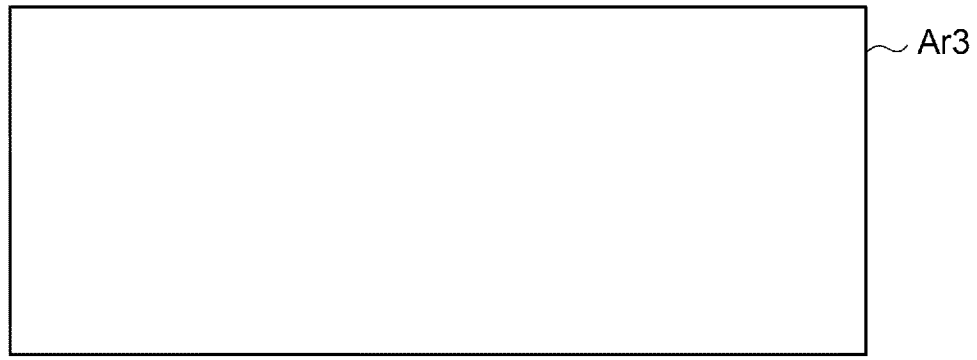

FIG. 9 is a diagram showing an example of the size of the transistor 121, the size of the transistor 123, and the size of the transistor 125 formed in the pre-driver 100 in plan view.

In order to satisfy R1<R2, the size of the transistor 125 needs to be smaller than the size of the transistor 123. Therefore, an area Ar5 in which the transistor 125 is formed is narrower than an area Ar3 in which the transistor 123 is formed.

Note that an area Ar1 in which the transistor 121 is formed is substantially the same as the area Ar5 in which the transistor 125 is formed.

Further, since the P-channel type transistor 121 is formed in the area Ar1 and the N-channel type transistor 125 is formed in the area Ar5, a gap between the areas Ar1 and Ar5 is larger in plan view than a gap between the areas Ar5 and Ar3, in which the transistors of the same channel are formed, to prevent latch-up.

Figure 10:
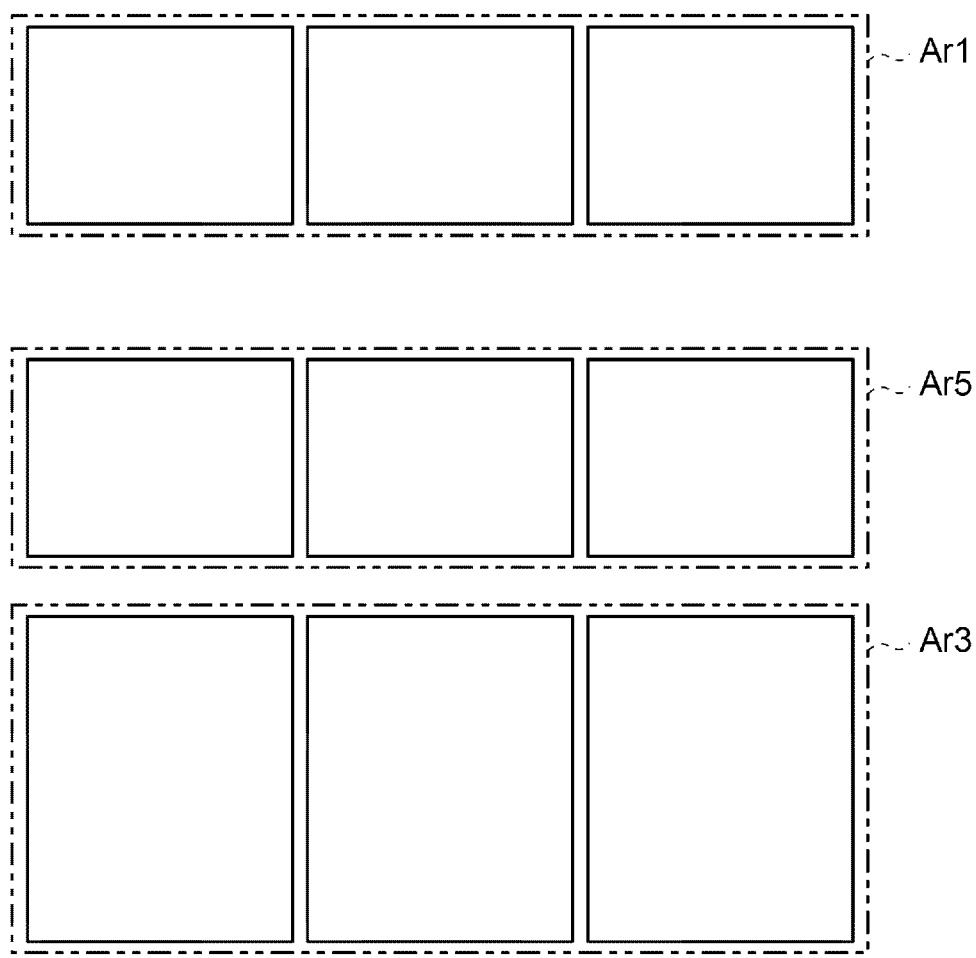
FIG. 10 is a diagram showing an example of a transistor layout in the drive control device.

As shown in FIG. 10, the areas Ar1, Ar3, and Ar5 may be further divided into a plurality of areas, and a plurality of transistors formed in the divided areas may be wired in parallel.

In the present embodiment, since the negative surge current flows in a saturated manner due to a current limiting function of the transistor 125, there is no need to provide a protective diode externally with respect to the drive control device 10, and there is no cost increase. Moreover, since it is not necessary to change the manufacturing process of the drive control device 10 that is a semiconductor device, an increase in cost can also be prevented in this respect.

Note that, in the transistors 133 and 135 provided between the nodes VH and V in the V-phase, similarly to the transistors 123 and 125, the negative surge current flows in a saturated manner by the current limiting function.

Figure 11:
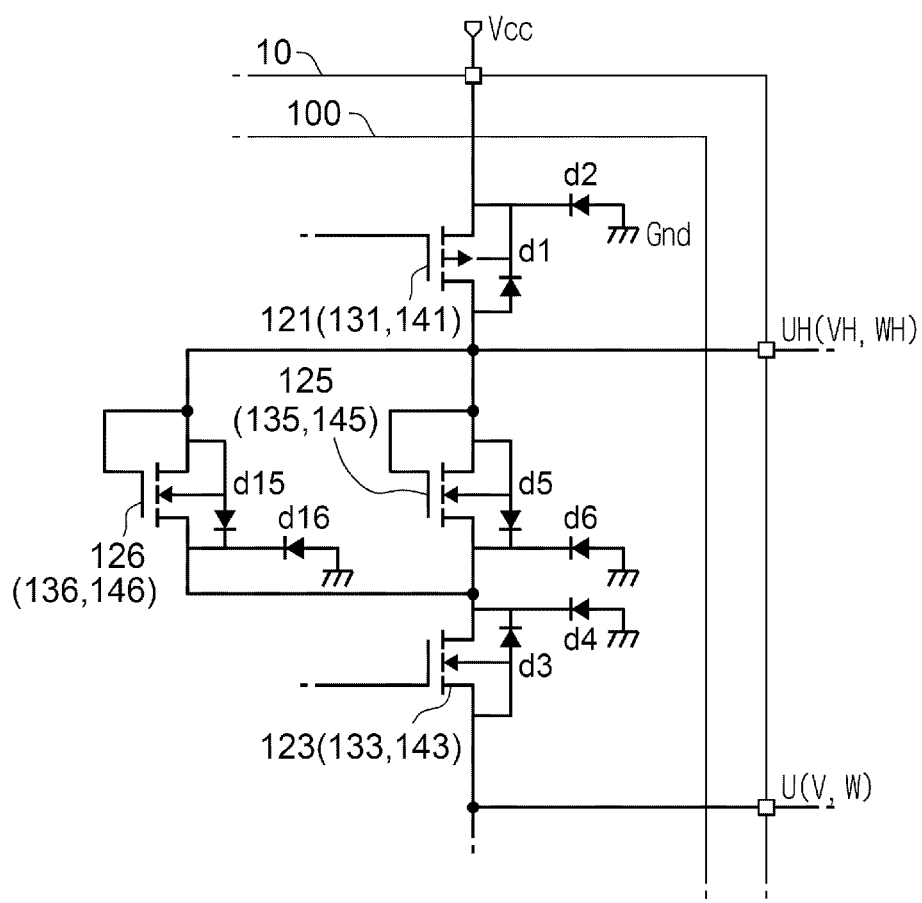
FIG. 11 is a diagram showing a main portion of a drive control device according to a second embodiment.

FIG. 11 is a diagram showing a main portion configuration in the pre-driver 100 of the drive control device according to a second embodiment. In this figure, a transistor 126 is coupled in parallel to the transistor 125.

The transistor 126 is an NMOS and has a source node and a gate node coupled to the node UH. The drain node of the transistor 126 is coupled to the drain node of the transistor 123 and the drain node of the transistor 125. That is, the transistor 126 is always turned off and is coupled in parallel to the transistor 125 with each other in a direction where a parasitic diode d15 is the same direction as the diode d5 of the transistor 125.

Note that a diode d16 is also parasitic on the transistor 126, and a forward direction thereof is from the ground node toward the drain node. The transistor 126 is an example of a seventh transistor.

In the configuration including the transistors 125 and 126, in the sink operation, the transistor 121 is turned off and the transistor 123 is turned on. When the voltage between the source node and the drain node in the transistor 125 is equal to or higher than the voltage at which the diode d5 is turned on, the sink current Isnk branches into two paths of the diode d5 of the transistor 125 and the channel area of the transistor 126, and flows through a path that joins the transistor 123 in the ON state. In this case, the current flowing in the channel area of the transistor 125 is negligibly small.

In the first embodiment, when the size of the depletion type transistor 125 is determined according to the current value Isat in order to limit the current when a negative surge occurs, the size and characteristics of the parasitic diode d5 are also determined at the same time. Therefore, since the ON resistance of the diode d5 in the sink operation is also determined, it can be said that the degree of freedom in design is small.

On the other hand, in the second embodiment, since the off transistor 126 is coupled in parallel to the transistor 125, the combined resistance from the source node toward the drain node of the transistor 125 during the sink operation can be made smaller than that in the case of only the ON resistance of the diode d5 (see FIG. 7).

Specifically, in the second embodiment, even when the size of the transistor 125 is determined and the ON resistance of the diode d5 is determined according to the current value Isat, the sink current Isnk can flow in a state lower than the ON resistance of the diode d5, that is, in parallel coupling with the transistor 126.

Therefore, in the second embodiment, even when the size of the transistor 125 is determined according to the current value Isat, since the resistance of the path through which the sink current Isnk is released is not uniquely determined, the degree of freedom in designing the resistance in the path can be increased as compared with the first embodiment.

In the second embodiment, the load on the transistor 125 in the sink operation is reduced by the parallel coupling. Therefore, since the resistance to electro-migration in a contact hole is improved, the reliability can be increased.

Note that in the sink operation, when the voltage between the source node and the drain node in the transistor 125 is lower than the voltage at which the diode d5 is turned on, the sink current Isnk flows through the channel area of the transistor 125 and the transistor 123 in the ON state.

Although the node UH and the node U in the U-phase have been described here, the node VH and the node V in the V-phase, and the node WH and the node W in the W-phase have the same configurations. Specifically, at the node VH and the node V in the V-phase, it is configured that the transistor 126 is replaced with the transistor 136 as shown in parentheses in FIG. 11. The transistor 136 is an example of an eighth transistor.

Further, at the node WH and the node W in the W-phase, it is configured that the transistor 126 is replaced with the transistor 146 as shown in parentheses in FIG. 11.

Figure 12:
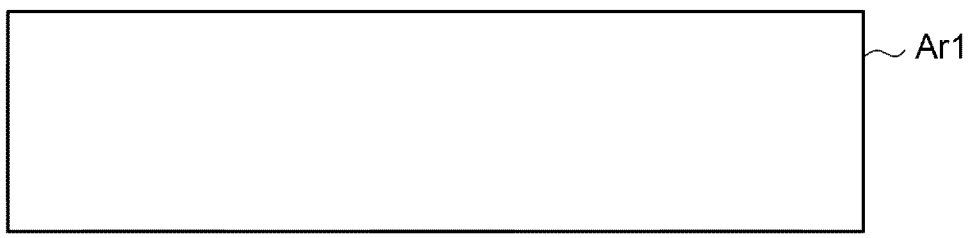
FIG. 12 is a diagram showing an example of a transistor layout in the drive control device.
Figure 12:
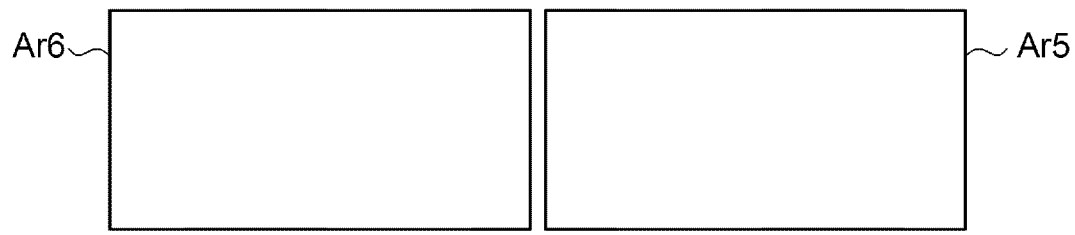
Figure 12:
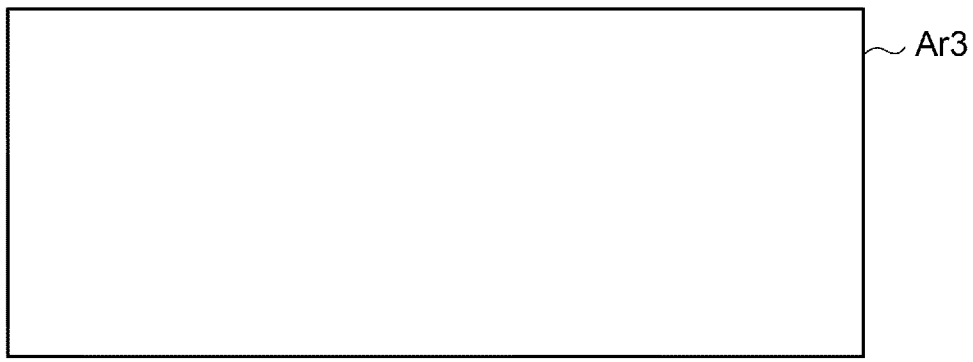

FIG. 12 is a diagram showing an example of the size of each transistor in plan view in the configuration including the transistors 125 and 126. In this figure, an area Ar5 is an area in which the transistor 125 is formed, and an area Ar6 is an area in which the transistor 126 is formed. The areas Ar5 and Ar6 are provided by dividing the area Ar5 shown in FIG. 9 substantially equal parts. Note that the transistor 126 used in a normally-OFF state is desirably aligned with the source and drain structures of the transistor 123.

The first embodiment and the second embodiment described above can be modified and applied as follows. Such modification examples and application examples will be described.

Figure 13:
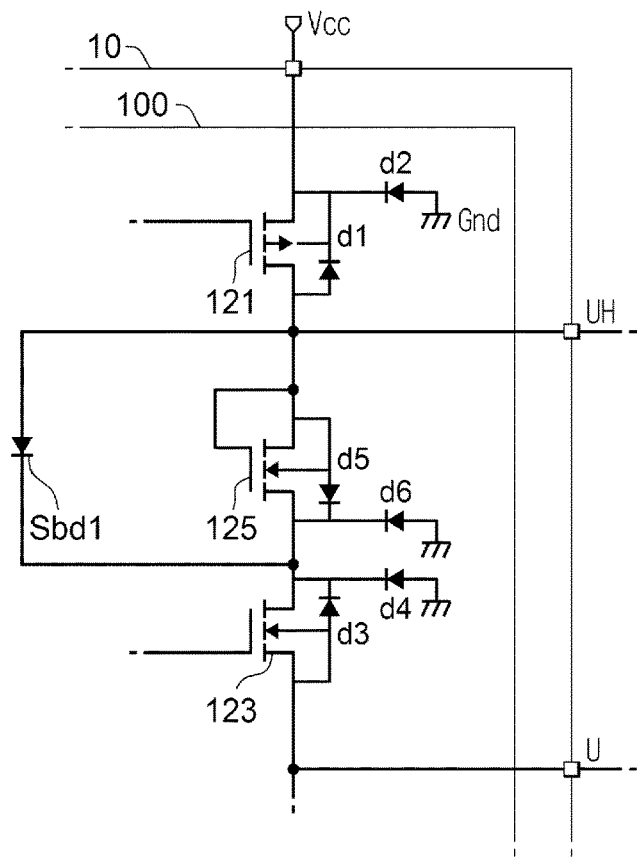
FIG. 13 is a diagram showing a main portion of a drive control device according to a first application example.

FIG. 13 is a diagram showing a main portion configuration of the pre-driver 100 according to a first application example. In a circuit shown in this figure, the transistor 126 in FIG. 11 is replaced with a diode Sbd1. The diode Sbd1 is a Schottky barrier diode, and a forward drop voltage is lower than a forward drop voltage Vf of the parasitic diode d5 in the depletion type transistor 125. Therefore, according to the first application example, since the voltage Vt at which the degree of attenuation of the voltage Vout is switched can be lowered, the high-side transistor 32U in the subsequent stage can be driven efficiently.

Figure 14:
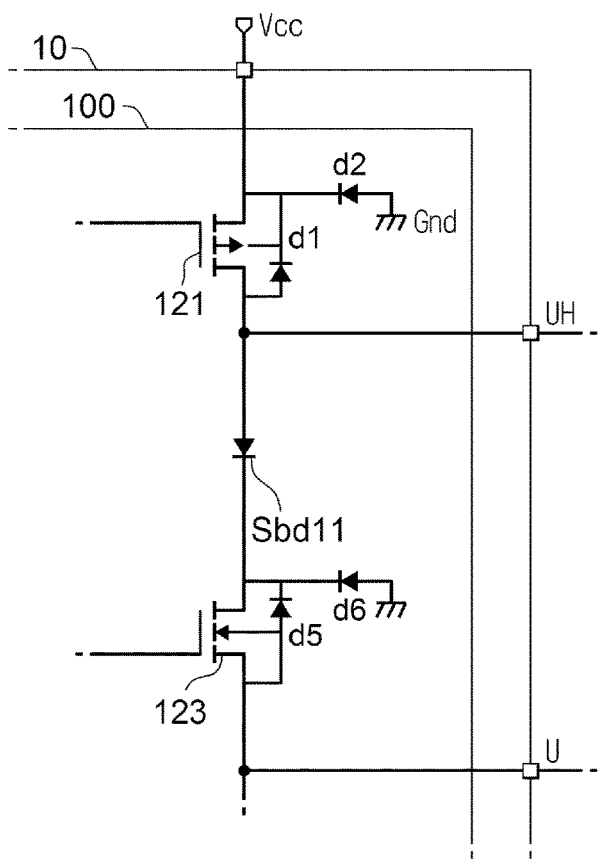
FIG. 14 is a diagram showing a main portion of a drive control device according to a second application example.

FIG. 14 is a diagram showing a main portion configuration of the pre-driver 100 according to a second application example. In the circuit shown in this figure, it is configured that the transistor 125 in FIG. 2 is replaced with the Schottky barrier diode Sbd1. Even in this configuration, it is possible to improve the efficiency of the sink operation while taking measures against the negative surge voltage.

Figure 15:
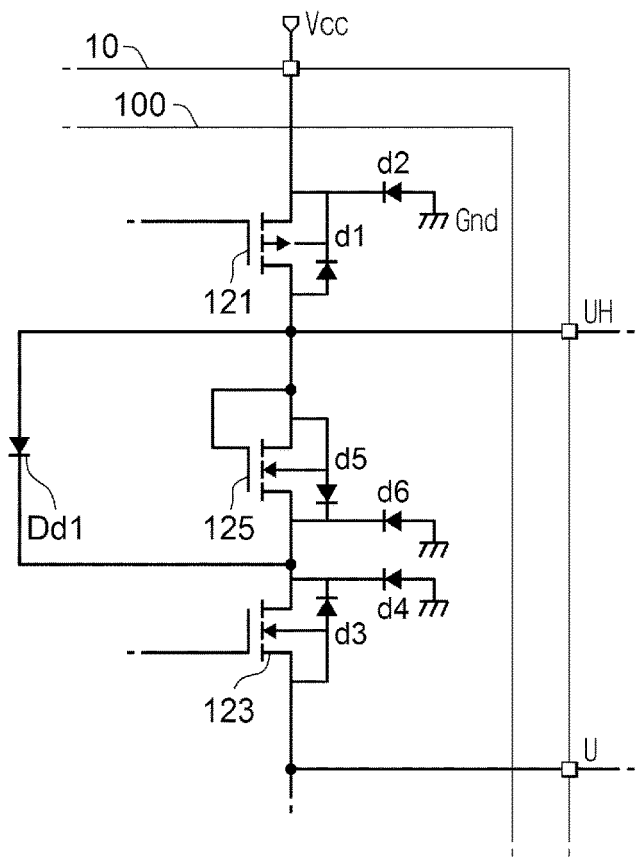
FIG. 15 is a diagram showing a main portion of a drive control device according to a third application example.

FIG. 15 is a diagram showing a main portion configuration of the pre-driver 100 according to a third application example. In a circuit shown in this figure, the transistor 126 in FIG. 11 is replaced with a diode Dd1. The diode Dd1 is not a Schottky barrier diode but a normal diode, that is, a pn bond diode. Therefore, the diode Dd1 can form a smaller space than the normally-OFF transistor 126. Thus, according to the third application example, a circuit space can be reduced as compared with the second embodiment shown in FIG. 11.

Figure 16:
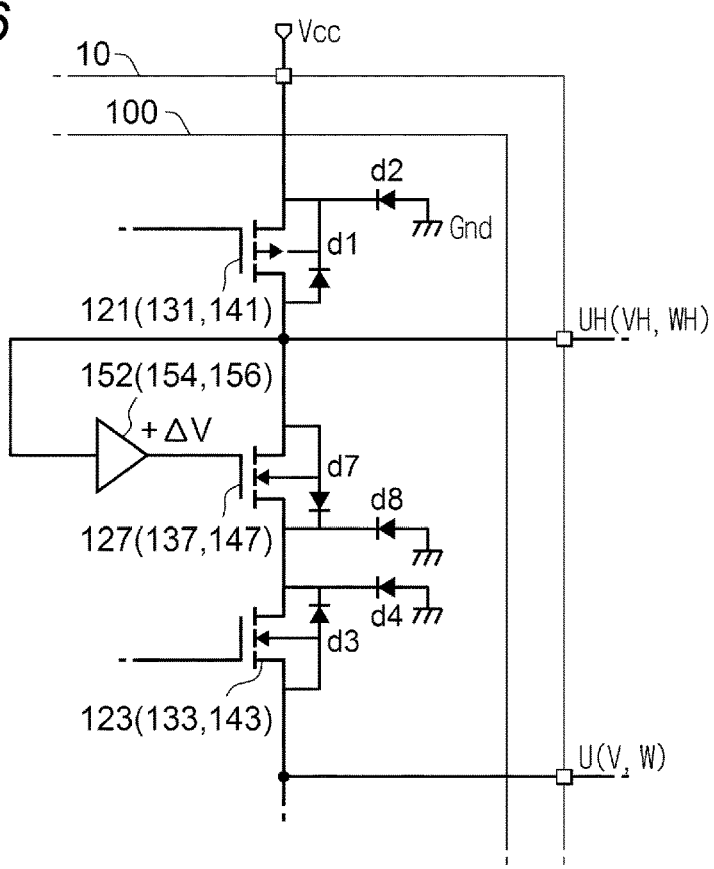
FIG. 16 is a diagram showing a main portion of a drive control device according to a fourth application example.

FIG. 16 is a diagram showing a main portion configuration of the pre-driver 100 according to a fourth application example. In the circuit shown in FIG. 16, the transistor 123 in FIG. 2 is replaced with a normal transistor 127, and a bias amplifier 152 is provided. Further, the output terminal of the bias amplifier 152 is coupled to a gate node of the transistor 127.

Note that the normal transistor 127 here is specifically the same enhancement type as the transistor 125, for example. Further, the transistor 127 is an NMOS.

For the transistor 127, a source node is coupled to the node UH, and a drain node is coupled to the drain node of the transistor 125. Therefore, a direction of the diode d7 that is parasitic on the transistor 127 is the same direction as the diode d5 of the transistor 125 in FIG. 2. Note that the diode d8 is a diode that is parasitic on the transistor 127 like the diode d7, and a forward direction thereof is a direction from the ground node toward the drain node.

The bias amplifier 152 is configured with, for example, an operational amplifier, adds the voltage of the source node in the transistor 127 by a voltage ΔV as a predetermined value, and applies the added voltage to the gate node of the transistor 127. The voltage ΔV is set so as to be a predetermined saturated drain current. In the transistor 127, since the voltage at the source node is added by the voltage ΔV and applied to the gate node, when a negative surge occurs at the node UH, similar to the depletion type transistor 125, a current limitation corresponding to the saturation current is applied. Note that when the negative surge voltage greatly swings to the negative side, it is assumed that the voltage falls below the negative power supply of the bias amplifier 152. However, in this case, the output voltage of the bias amplifier 152 also swings to the negative side, so that the transistor 127 becomes the OFF state.

In this configuration, the sink current flows through the diode d7 in the sink operation. Therefore, the sink operation is the same as in the first embodiment.

As for the first to fourth application examples, although the node UH and the node U in the U-phase have been described here, the node VH and the node V in the V-phase, and the node WH and the node W in the W-phase have the same configurations.

For example, at the node VH and the node V in the V-phase, as shown in parentheses in FIG. 16, it is configured that the transistor 127 is replaced with a transistor 137, and the bias amplifier 152 is replaced with a bias amplifier 154, respectively. The transistor 127 is an example of a ninth transistor, and the transistor 137 is an example of a tenth transistor.

Further, at the node WH and the node w in the W-phase, as shown in parentheses in FIG. 16, it is configured that the transistor 127 is replaced with a transistor 147, and the bias amplifier 152 is replaced with a bias amplifier 156, respectively.

In the first embodiment, the second embodiment, and the first to fourth applications examples described above, the output stage of the node UH (VH, WH) coupled to the gate node of the high-side transistor 32U (32V, 32W) in the drive circuit 30 has been described in the pre-driver 100. In the pre-driver 100, the output stage of the node UL (VL, WL) coupled to the gate node of the low-side transistor 34U (34V, 34W) has almost the same configuration.

Figure 17:
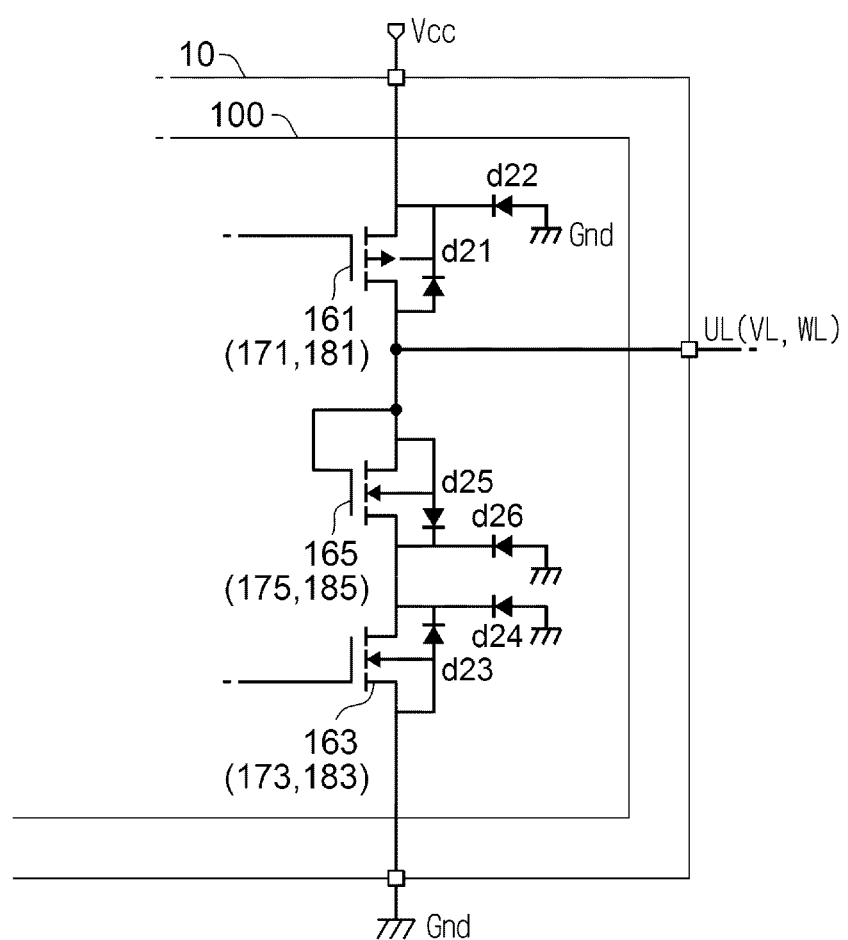
FIG. 17 is a diagram showing another main portion of the drive control device according to the first embodiment.

FIG. 17 is a diagram showing an output stage coupled to the node UL in the pre-driver 100 included in the drive control device 10 according to the first embodiment, for example.

In the configuration shown in FIG. 2, for example, regarding the node UL, the configuration shown in FIG. 17 is configured that the node UH is replaced with the node UL and the node U is replaced with the ground node of the ground potential Gnd, respectively.

Specifically, an enhancement type PMOS transistor 161 is provided between the power supply node and the node UL in the same direction as the transistor 121. Note that diodes d21 and d22 are diodes which are parasitic on the transistor 161. Among these, a forward direction of the diode d21 is a direction from the drain node toward the source node, and a forward direction of the diode d22 is a direction from the ground node toward the source node.

Similarly, a depletion type PMOS transistor 165 and an enhancement type NMOS transistor 163 are coupled in series between the node UL and the ground node. Further, the transistor 165 is provided in the same direction as the transistor 125, and the transistor 163 is provided in the same direction as the transistor 123, respectively.

Diodes d23 and d24 are diodes which are parasitic on the transistor 163, and diodes d25 and d26 are diodes which are parasitic on the transistor 165.

Among these, a forward direction of the diodes d23 and d25 is a direction from the source node toward the drain node, and a forward direction of the diodes d24 and d26 is a direction from a substrate toward the drain node.

In this configuration, in the node VL in the V-phase, as shown in parentheses in FIG. 17, it is configured that the transistor 161 is replaced with a transistor 171, the transistor 163 is replaced with a transistor 173, and the transistor 165 is replaced with a transistor 175, respectively.

The transistor 161 is an example of an eleventh transistor, and the transistor 163 is an example of a twelfth transistor. The transistor 171 is an example of a thirteenth transistor, and the transistor 173 is an example of a fourteenth transistor. The diode d25 parasitic on the transistor 165 is an example of a third diode, and the diode d25 parasitic on the transistor 175 is an example of a fourth diode.

Note that in the node WL and the node W in the W-phase, as shown in parentheses in FIG. 17, it is configured that the transistor 161 is replaced with a transistor 181, the transistor 163 is replaced with a transistor 183, and the transistor 165 is replaced with a transistor 185, respectively.

Even with such a configuration, since the negative surge current flows in a saturated manner by the current limiting function of the transistor 165 (175, 185), there is no need to provide a protective diode externally with respect to the drive control device 10, and there is no cost increase. Moreover, since it is not necessary to change the manufacturing process of the drive control device 10 that is a semiconductor device, an increase in cost can also be prevented in this respect.

When the motor M is small, the drive circuit 30 may be included in the drive control device 10 that is a semiconductor integrated circuit. A third embodiment in which the drive control device 10 includes the drive circuit 30 will be described.

Figure 18:
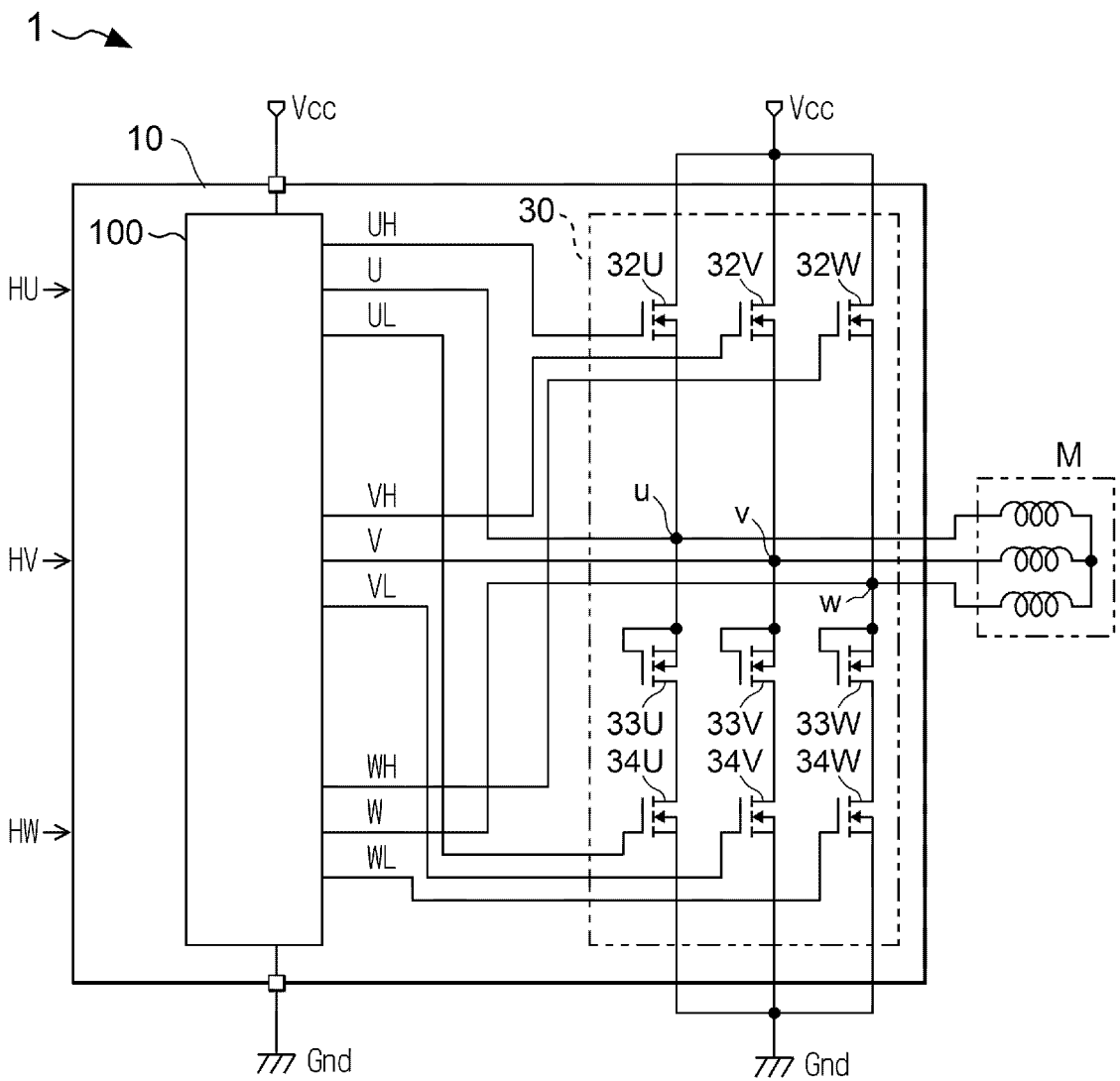
FIG. 18 is a diagram showing a configuration of an electric apparatus including a drive circuit according to a third embodiment.

FIG. 18 is a diagram showing a configuration of the drive control device 10 according to a third embodiment.

As shown in this figure, the drive circuit 30 includes transistors 33U, 33V, and 33W in addition to the high-side transistors 32U, 32V, and 32W and the low-side transistors 34U, 34V, and 34W. The transistors 33U, 33V, and 33W are, for example, depletion type N-channel MOSs.

The transistor 33U is provided between the node u and the drain node of the low-side transistor 34U. In the transistor 33U, the source node and the gate node are coupled to the node u, and the drain node is coupled to the drain node of the low-side transistor 34U. Therefore, a forward direction of the parasitic diode in the transistor 33U is a direction from the source node toward the drain node, as in the transistor 125 in FIG. 2, although not shown in particular.

The transistors 33V and 33W are provided in the same manner as the transistor 33U. Specifically, the transistor 33V is provided between the node v and the drain node of the low-side transistor 34V, and the transistor 33W is provided between the node w and the drain node of the low-side transistor 34W.

In the configuration shown in FIG. 18, for example, regarding the U-phase, the high-side transistor 32U, low-side transistor 34U, and transistor 33U have the same relationship as the transistors 121, 123, and 125 in FIG. 2. The same applies to the U-phase and the W-phase.

Therefore, in the configuration shown in FIG. 18 as well, it is not necessary to provide a protective diode externally with respect to the drive control device 10 as in the first embodiment, and since it is not necessary to change the manufacturing process of the drive control device 10, an increase in cost can be prevented.

The configuration shown in FIG. 18 can be applied to the second embodiment or the first to fourth application examples as appropriate in addition to the first embodiment.

Further, in the configuration shown in FIG. 18, the transistor 33U is an example of a fifth transistor, and a diode that is parasitic on the transistor 33U is an example of a first diode. The transistor 33V is an example of a sixth transistor, and a diode that is parasitic on the transistor 33V is an example of a second diode.

In the above description, the channel type of transistor or the like can be changed as appropriate. Further, in the configuration in FIG. 2, the transistor 123 is provided on the node U side and the transistor 125 is provided on the node UH side. However, conversely, the transistor 123 may be provided on the node UH side, and the transistor 125 may be provided on the node U side, respectively.

What is claimed is:

1. A drive control device for controlling a motor coupled to a first drive node and a second drive node by driving a first high-side transistor provided between a first power supply node having a first power supply potential and the first drive node, a first low-side transistor provided between the first drive node and a second power supply node having a second power supply potential lower than the first power supply potential, a second high-side transistor provided between the first power supply node and a second drive node, and a second low-side transistor provided between the second drive node and the second power supply node, the device comprising:
   a first output node coupled to a gate node of the first high-side transistor;
   a second output node coupled to the first drive node;
   a third output node coupled to a gate node of the first low-side transistor;
   a fourth output node coupled to a gate node of the second high-side transistor;
   a fifth output node coupled to the second drive node;
   a sixth output node coupled to a gate node of the second low-side transistor;
   a first transistor provided between the first power supply node and the first output node;
   a first diode and a second transistor provided in series between the first output node and the second output node;
   a third transistor provided between the first power supply node and the fourth output node; and
   a second diode and a fourth transistor provided in series between the fourth output node and the fifth output node, wherein
   the first transistor, the second transistor, the third transistor and the fourth transistor are enhancement types,
   a forward direction of the first diode is a direction from the first output node toward the second output node, and
   a forward direction of the second diode is a direction from the fourth output node toward the sixth output node.

2. The drive control device according to claim 1, wherein the first diode is a depletion type fifth transistor,
   a gate node of the fifth transistor is coupled to a source node of the fifth transistor,
   the second diode is a depletion type sixth transistor, and
   a gate node of the sixth transistor is coupled to a source node of the sixth transistor.

3. The drive control device according to claim 2, further comprising:
   a seventh transistor coupled in parallel to the fifth transistor; and
   an eighth transistor coupled in parallel to the sixth transistor, wherein
   a gate node of the seventh transistor is coupled to a source node of the seventh transistor, and
   a gate node of the eighth transistor is coupled to a source node of the eighth transistor.

4. The drive control device according to claim 1, wherein the first diode is a ninth transistor,
   a voltage obtained by shifting a voltage of a source node in the ninth transistor by a predetermined value is applied to a gate node of the ninth transistor,
   the second diode is a tenth transistor, and a voltage obtained by shifting a voltage of a source node in the tenth transistor by the predetermined value is applied to a gate node of the tenth transistor.

5. A drive control device for controlling a motor coupled to a first drive node and a second drive node by driving a first high-side transistor provided between a first power supply node having a first power supply potential and the first drive node, a first low-side transistor provided between the first drive node and a second power supply node having a second power supply potential lower than the first power supply potential, a second high-side transistor provided between the first power supply node and the second drive node, and a second low-side transistor provided between the second drive node and the second power supply node, the device comprising:
 a first output node coupled to a gate node of the first high-side transistor;
 a second output node coupled to the first drive node;
 a third output node coupled to a gate node of the first low-side transistor;
 a fourth output node coupled to a gate node of the second high-side transistor;
 a fifth output node coupled to the second drive node;
 a sixth output node coupled to a gate node of the second low-side transistor;
 an eleventh transistor provided between the first power supply node and the third output node;
 a third diode and a twelfth transistor provided in series between the third output node and the second power supply node;
 a thirteenth transistor provided between the first power supply node and the sixth output node; and
 a fourth diode and a fourteenth transistor provided in series between the sixth output node and the second power supply node, wherein
 the eleventh transistor, the twelve transistor, the thirteenth transistor and the fourteenth transistor are enhancement types,
 a forward direction of the third diode is a direction from the third output node toward the second power supply node, and
 a forward direction of the fourth diode is a direction from the sixth output node toward the second power supply node.

6. A vehicle powered by a rotation of a motor, comprising:
 the motor;
 the first high-side transistor, the second high-side transistor, the first low-side transistor, and the second low-side transistor; and
 the drive control device according to claim 1.

* * * * *